(12) United States Patent
Pretscher

(10) Patent No.: US 12,205,838 B2
(45) Date of Patent: Jan. 21, 2025

(54) DEVICE AND METHOD FOR MOVING AN OBJECT INTO A PROCESSING STATION, CONVEYING SYSTEM AND PROCESSING APPARATUS

(71) Applicant: Atotech Deutschland GmbH, Berlin (DE)

(72) Inventor: Rüdiger Pretscher, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 522 days.

(21) Appl. No.: 17/621,448

(22) PCT Filed: Jun. 24, 2020

(86) PCT No.: PCT/EP2020/067697
§ 371 (c)(1),
(2) Date: Dec. 21, 2021

(87) PCT Pub. No.: WO2020/260389
PCT Pub. Date: Dec. 30, 2020

(65) Prior Publication Data
US 2022/0336243 A1    Oct. 20, 2022

(30) Foreign Application Priority Data

Jun. 26, 2019 (EP) .................................. 19182628

(51) Int. Cl.
*H01L 21/67* (2006.01)
*B05C 3/132* (2006.01)
(Continued)

(52) U.S. Cl.
CPC ........ *H01L 21/67326* (2013.01); *B05C 3/132* (2013.01); *H01L 21/67706* (2013.01); *H01L 21/67736* (2013.01)

(58) Field of Classification Search
USPC .......................................... 118/429, 428, 500
See application file for complete search history.

(56) References Cited

U.S. PATENT DOCUMENTS

2003/0012885 A1\* 1/2003 Gramarossa ...... H01L 21/67718
427/424
2003/0077396 A1\* 4/2003 LeCompte ................ B05C 3/09
427/430.1
(Continued)

FOREIGN PATENT DOCUMENTS

JP          2014189806 A  \* 10/2014 ............. B65G 45/10
WO        2017093382 A1     6/2017

OTHER PUBLICATIONS

English Translation JP-2014189806A (Year: 2014).\*
(Continued)

*Primary Examiner* — Yewebdar T Tadesse
(74) *Attorney, Agent, or Firm* — Renner, Otto, Boisselle & Sklar, LLP

(57) ABSTRACT

A device for moving an object including a substrate through an open side of a processing station of a processing apparatus including a support, placeable at the processing station. The device includes a carrier, guided for movement relative to the support along a path predominantly directed in parallel to a reference axis in a reference co-ordinate system. The device includes a device for controlling movement of the carrier and driving the movement in an opposite direction along the path. The device includes a component for holding the object and a suspension mechanism with which the holding component is connected to the carrier. The suspension mechanism is arranged to guide movement of the holding component relative to the carrier along a holding component path. The device is arranged to drive the movement of the holding component along the holding compo-
(Continued)

nent path. The holding component path is predominantly directed parallel to the reference axis.

14 Claims, 9 Drawing Sheets

(51) Int. Cl.
  *H01L 21/673* (2006.01)
  *H01L 21/677* (2006.01)

(56) References Cited

U.S. PATENT DOCUMENTS

| | | | |
|---|---|---|---|
| 2004/0037682 | A1 | 2/2004 | Yoshioka et al. |
| 2012/0308346 | A1* | 12/2012 | Keigler .................. H01L 21/68 414/222.09 |
| 2014/0245954 | A1 | 9/2014 | Minami et al. |
| 2015/0270151 | A1 | 9/2015 | Yokoyama et al. |
| 2018/0282893 | A1 | 10/2018 | Yamasaki et al. |

OTHER PUBLICATIONS

PCT/EP2020/067697; International Search Report and Written Opinion of the International Searching Authority dated Sep. 4, 2020.

* cited by examiner

DEVICE AND METHOD FOR MOVING AN OBJECT INTO A PROCESSING STATION, CONVEYING SYSTEM AND PROCESSING APPARATUS

This application is a national phase of International Application No. PCT/EP2020/067697, filed 24 Jun. 2020, which claims priority to European Patent Application No. 19182628.8 filed 26 Jun. 2019, the entire disclosures of which are hereby incorporated by reference.

TECHNICAL FIELD

The invention relates to a device for moving an object comprising at least a substrate through an open side of a processing station of a processing apparatus, the device comprising:
- at least one support, placeable at the processing station,
- at least one carrier, each guided for movement relative to the support(s) along a respective path predominantly directed in parallel to a reference axis in a reference co-ordinate system;
- at least one device for controlling the movement of at least one of the carriers and driving the movement in at least one of opposite directions along the path;
- a component for holding the object; and
- a suspension mechanism with which the holding component is connected to the at least one carrier,
- wherein the suspension mechanism is arranged to guide movement of the holding component relative to the at least one carrier along a holding component path, and
- wherein the device is arranged to drive the movement of the holding component in at least one direction along the holding component path.

The invention also relates to a system for conveying an object comprising at least a substrate between processing stations of a processing apparatus.

The invention also relates to a processing apparatus.

The invention also relates to a method of handling a substrate in a processing apparatus.

BACKGROUND ART

US 2018/0282893 A1 discloses an electrolytic plating apparatus. The electrolytic plating apparatus comprises a horizontal guide, a horizontal transporting mechanism, a vertical guide, a vertical transporting mechanism and an arm. The horizontal transporting mechanism is a mechanism to move the substrate in a transporting direction. The vertical transporting mechanism is a mechanism to move the substrate in the vertical direction. The arm is provided on the vertical transporting mechanism. The longitudinal direction of the arm is a direction perpendicular to a plane defined by the transporting direction and the vertical direction. The substrate is held by a substrate holder. The substrate holder is connected to and gripped by a gripping mechanism. The holder gripping mechanism is provided near a distal end of the arm. The electrolytic plating apparatus is provided with a moving mechanism near the distal end of the arm. The moving mechanism is a mechanism independent of the substrate transporting section for moving the holder gripping mechanism. The moving mechanism includes a rotation mechanism and a linear motion mechanism. The rotation mechanism is a mechanism for rotationally moving the holder gripping mechanism around the vertical direction as an axis. The linear motion mechanism is a mechanism that linearly moves the holder gripping mechanism along the longitudinal direction of the arm.

A problem of the known apparatus is that the apparatus needs to be relatively high. The substrate needs to be lifted high enough for its lower edge to clear the processing stations over which the substrate is to be moved horizontally. The substrate must also be lowered sufficiently far down into each processing station to allow the substrate to be processed correctly. This determines the stroke of the arm and thereby the height of the vertical lifting mechanism.

SUMMARY OF INVENTION

It is an object of the invention to provide a device, conveying system, processing apparatus and method of the types defined above in the opening paragraphs that allow the processing apparatus provided with the device or conveying system to have a relatively small dimension in the direction of the reference axis.

This object is achieved according to a first aspect by the device according to the invention, which is characterised in that the holding component path is predominantly directed in parallel to the reference axis.

For ease of explanation, it will be assumed that the reference axis is an essentially vertical reference axis, so that the open side of the processing station is a top side of the processing station. The object comprising the substrate can thus be raised out of and lowered into the processing station by the device. In an alternative embodiment, the reference axis may be a horizontal axis.

Paths predominantly directed in parallel to the reference axis are at an angle of no more than 45° to the reference axis. In practical implementations, the angle will be below 10° or even 5°. The paths will thus be directed essentially in parallel to the reference axis.

Because the component for holding the object can be raised and lowered relative to the carrier or carriers, the stroke of the carriers can be shorter.

Since this stroke determines the height of the space required to accommodate the device, the overall height of the processing apparatus provided with the device is reduced.

The device may be movable between processing stations or associated with only one processing station, in which case the at least one support is placed at the processing station. There may be one support on one side of the processing station, supports on either side of the processing station, or a support frame. The at least one supports may themselves be supported by a further structure, e.g. a transporter frame.

There may be one carrier, e.g. a bar to which the holding component is attached at one point. Alternatively, there may be multiple carriers guided for movement in tandem, with the suspension mechanism including links between the holding component and each of the carriers. Each carrier is guided for movement relative to at least one of the supports. Multiple carriers may be guided for movement relative to a single support. Where multiple carriers are provided, these carriers may have respective paths of movement at a slight angle to the reference axis, inclined in different directions, but collectively move the holding component along a path essentially parallel to the reference axis.

The carriers may be in the form of pivots at the ends of pistons or plungers of an actuator, e.g. a pneumatic or hydraulic actuator. Alternatively, the carriers may be travellers guided along a guide fixed to the support. In either case, the connection between the carrier and the support determines the path of the carrier. The movement paths will generally be essentially linear, so that the movement of each carrier corresponds to a translation.

At least one device is provided between the support and the carrier for controlling the movement of the carrier relative to the support. This device is arranged to exert a force sufficient to move the carrier or carriers and the holding component with the object. The at least one movement control device may also drive the movement of the holding component relative to the carriers(s), as will be explained. Alternatively, a further actuator or motor may drive the movement of the holding component relative to the at least one carriers. The movement may be driven in only one sense along the path, which would correspond to upwards movement of the holding component in case the reference axis is an essentially vertical reference axis. The movement in the reverse sense need not be driven by a component of the device, but could be gravity-driven. Regardless of the orientation of the reference axis, the reverse movement of at least one of the carriers and the holding component could be driven by a resilient component.

To move the object into the processing station, the carrier or carriers are moved towards the processing station relative to the support or supports and the holding component is moved towards the processing station relative to the carrier or carriers. To withdraw the object from the processing station, the carrier or carriers are moved relative to the support or supports in the reverse direction, and the holding component is moved away from the processing station relative to the carrier or carriers to which the suspension mechanism connects the holding component.

In an embodiment, the reference axis is a first reference axis in a reference co-ordinate system further comprising a second reference axis perpendicular to the first reference axis, and the holding component has an elongated shape extending in parallel to the second reference axis.

This embodiment is particularly adapted to processing apparatus with multiple processing stations for processing planar substrates, where the substrate is moved into and out of the processing station in a plane parallel to a plane of the substrate. An example is a so-called vertical processing apparatus, in which the processing stations are arranged in a row extending in a direction of a third reference axis, perpendicular to both the first and second reference axes. The processing stations can have a relatively small extent in the direction of the third reference axis, because the substrate is held with its plane perpendicular to the third reference axis. Because the extent of the processing stations in the direction in which they are aligned is relatively small, the processing apparatus can be relatively compact in all three dimensions.

In an embodiment, the reference axis is a first reference axis in a reference co-ordinate system further comprising a second reference axis perpendicular to the first reference axis, and the holding component is provided with engagement features for engaging the object at at least two different locations along the second reference axis.

This embodiment has the effect of helping to counter rotation of the substrate about an axis parallel to the reference axis. The embodiment further helps counter rotation of the substrate, at least relative to the carrier or carriers, about an axis parallel to a third reference axis perpendicular to the first and second reference axes. If the substrate and the object are planar and moved in a plane essentially parallel to the plane of the substrate and the object, the processing station can have an opening in the form of a relatively narrow slit, through which the object is moved into and out of the processing station.

In an embodiment, the holding component is provided with at least one engagement feature for releasably interlocking with at least one engagement feature of the object.

An effect of this feature is to allow the device to be used for other purposes whilst the substrate is being processed in the processing station. The device can release the object when the object is in place for processing in the processing station. If the device is comprised in a conveying system for moving the object between multiple processing stations of the processing apparatus, the device can be moved to another processing station to handle a further object comprising a further substrate. Furthermore, the interlocking engagement can help counter movement of the object relative to the holding component, e.g. swinging of the object.

In a particular example of this embodiment, the holding component comprises at least one actuator for moving at least one of the engagement features of the holding component into and out of engagement with at least one of the engagement features of the object.

An effect is that play between the engagement features can be largely avoided. Because the holding component comprises the at least one actuator, the object need not be provided with the actuator. The object can comprise only stationary engagement features.

In a further example of any embodiment of the device in which the holding component is provided with at least one engagement feature for releasably interlocking with at least one engagement feature of the object, the engagement features of the holding component comprise at least one element shaped and arranged to hook behind an engagement feature of the object, and at least an end of the element proximal to the object, in use, is movable laterally with respect to the reference axis.

This example is of particular application where the reference axis is a vertical reference axis. The object can in effect be hung on the engagement features. The engagement features of the holding component are moved to hook under engagement features of the object to accomplish the interlocking engagement.

In a particular example of an embodiment in which the reference axis is a first reference axis in a reference co-ordinate system further comprising a second reference axis perpendicular to the first reference axis, the holding component is provided with engagement features for engaging the object at at least two different locations along the second reference axis, and the holding component is provided with at least one engagement feature for releasably interlocking with at least one engagement feature of the object, the engagement features of the holding component include at least two elements shaped to present abutments facing in opposite respective directions along the second reference axis.

The abutments contact the engagement features of the object from opposite sides, seen in the direction of the second reference axis. This positions the object relative to the holding component in that direction. Relative movement in that direction is essentially prevented.

An embodiment of the device comprises at least one substrate holder for receiving the substrate so as to leave at least part of the substrate exposed, wherein the object further comprises the substrate holder and the holding component is arranged to hold the substrate holder.

As a result, there is less risk of damage to the substrate. This is of particular application where the holding component is provided with at least one engagement feature for releasably holding the object, and more particularly where the processing apparatus comprises multiple processing stations with the device being part of a conveying system for moving the object between stations. In that case, the object is placed in each processing station, released and later picked up again to extract the object from the processing station concerned and move the object to the next processing station. Repeated engagement is with the substrate holder, not the substrate.

In a particular example of this embodiment, the substrate holder is arranged to receive a planar substrate so as to cover at least a border region of each of opposing major surfaces of the substrate along a perimeter of the substrate whilst leaving at least a section of at least one of the major surfaces exposed.

Vulnerable edges of the substrate are thus protected, because the substrate holder frames or covers each major surface of the planar substrate. Where both major surfaces are framed, the substrate can be processed on both sides simultaneously.

In an example of the embodiment in which the device comprises at least one substrate holder for receiving the substrate so as to leave at least part of the substrate exposed, the object further comprises the substrate holder and the holding component is arranged to hold the substrate holder, the substrate holder has a planar configuration and the substrate holder includes a carrier part extending in a plane of the substrate holder adjacent a section of the substrate holder for receiving the substrate.

The carrier part forms the part of the substrate holder proximal to the holding component of the device for moving the object into and out of the processing station. The carrier part may itself comprise multiple elements. Such parts of the carrier part may also be integrally connected to one or more parts comprised in the section for receiving the substrate. The integrally connected parts would then be made in one piece. The section for receiving the substrate can be inserted relatively far into the processing station without the device for moving the object into and out of the processing station, in particular the holding component, needing to reach very far into the processing station.

In a particular version of this example, the carrier part includes end sections projecting laterally in opposite directions with respect to the section for receiving the substrate.

This version is of particular application in a vertical processing station, where the section for receiving the substrate can be suspended from the carrier part. The carrier part can be supported by the projecting end sections, e.g. on either side of a bath in which the section for receiving the substrate is submergible.

In a particular version of this embodiment, the end sections are provided with features for engaging supports in a processing station, wherein the features are provided on a same side of the carrier part as a side on which the section for receiving the substrate extends.

The device for moving the object into and out of the processing station can thus simply drop the object onto the supports provided in the processing station.

In a particular embodiment, the features for engaging supports in a processing station are shaped to interlock with features of the supports in the processing station to prevent relative movement in a direction parallel to the direction in which the carrier part extends.

This is useful in conjunction with processing stations in which the supports move the substrate holder in a plane of the substrate during processing.

In a variant of the embodiment comprising at least one substrate holder for receiving the substrate so as to leave at least part of the substrate exposed, wherein the object further comprises the substrate holder and the holding component is arranged to hold the substrate holder, the substrate holder has a planar configuration, the substrate holder includes a carrier part extending in a plane of the substrate holder adjacent a section of the substrate holder for receiving the substrate, the carrier part includes end sections projecting laterally in opposite directions with respect to the section for receiving the substrate, the end sections are provided with features for engaging supports in a processing station, and the features are provided on a same side of the carrier part as a side on which the section for receiving the substrate extends, the features for engaging supports in a processing station are shaped to interlock with features of the supports in the processing station to prevent relative movement in a direction transverse to the plane of the substrate holder.

Rotation about an axis in the plane of the substrate holder extending in a direction transverse to the carrier part can thus be prevented. The same is the case for movement in a direction transverse to the plane of the substrate holder.

In an example of an embodiment comprising at least one substrate holder for receiving the substrate so as to leave at least part of the substrate exposed, wherein the object further comprises the substrate holder and the holding component is arranged to hold the substrate holder, the substrate holder has a planar configuration, the substrate holder includes a carrier part extending in a plane of the substrate holder adjacent a section of the substrate holder for receiving the substrate, and the carrier part includes end sections projecting laterally in opposite directions with respect to the section for receiving the substrate, the projecting end sections each comprise a section extending in a same direction as the section of the substrate holder for receiving the substrate relative to a central section of the carrier part.

The end sections can thus arch over a barrier, e.g. a side wall of a bath for receiving the section of the substrate holder in which the substrate is received.

In an embodiment of the device for moving the object, at least one of the devices for controlling the movement of at least one of the carriers is also arranged to drive the movement of the holding component.

This embodiment requires fewer actuators. This also means that synchronisation between actuators can be relatively uncomplicated.

In an example of this embodiment, at least one carrier is provided with a part movably journalled to the carrier, the carrier is guided for movement along one of the supports past a feature arranged to engage the movable part from at least a certain position along the path of the carrier along the support, and the suspension mechanism comprises a mechanism for translating movement of the movable part relative to the carrier into movement of the holding component relative to the carrier.

The feature arranged to engage the movable part may in one implementation only engage the movable part from a particular position along the path of the carrier onwards. In another implementation, the engagement is permanent. Because the movable part is engaged and the carrier is moved onwards by the at least one device for controlling the movement of at least one of the carriers, the movable part is caused to move relative to the carrier, which relative movement is translated into movement of the holding component relative to the carrier. The carrier or holding component need not be provided with a separately powered actuator for moving the holding component relative to the at least one carrier. The feature arranged to engage the movable part may be fixed to the at least one support. The feature is at least located at a fixed position along the reference axis.

In an example of this embodiment, wherein the movable part or parts is or are comprised in the mechanism for translating movement of the movable part relative to the carrier into movement of the holding component relative to the carrier and comprise at least one lever, pivotably arranged on the carrier.

The lever also forms a transmission mechanism, in that a small displacement of the lever relative to the feature arranged to engage the movable part can translate into a relatively large displacement of the holding component. Furthermore, the lever may be a first-class lever. Movement of one of its arms relative to the carrier in a first direction along the reference axis results in movement of the other of its arms in the opposite direction along the reference axis. One of the arms can thus be engaged by the feature and the other of the arms can be coupled to the holding component, either directly or indirectly.

In a particular version hereof, the mechanism for translating movement of the movable part relative to the carrier into movement of the holding component relative to the carrier is connected to the holding component via a traveller, e.g. a traveller movable along an arm of the lever.

The traveller may be journalled in any of many different ways, including via a ball or roller bearing. Although direct contact between the traveller and the guide along which the traveller is movable is not required, this may be the case in some embodiments. The traveller ensures that pivoting movement of the lever results only in translatory movement of the holding component in a direction predominantly parallel to the reference axis.

In a particular version of the embodiment in which at least one of the devices for controlling the movement of at least one of the carriers is also arranged to drive the movement of the holding component and in which at least one carrier is provided with a part movably journalled to the carrier, the carrier is guided for movement along one of the supports past a feature arranged to engage the movable part from at least a certain position along the path of the carrier along the support, and the suspension mechanism comprises a mechanism for translating movement of the movable part relative to the carrier into movement of the holding component relative to the carrier, the movable part is guided for linear motion relative to the carrier in a direction at least approximately directed in parallel to the holding component path, and the mechanism for translating movement of the movable part relative to the carrier into movement of the holding component relative to the carrier comprises a further movable part guided for linear motion relative to the carrier in a direction at least approximately directed in parallel to the holding component path and a force transfer device for transferring a force between the movable part and the further movable part.

At least the respective components of movement of the movable part and further movable part that are directed in parallel to the holding component path will generally be oppositely directed. Thus, as movement of the movable part is arrested by the feature engaging the movable part, the carrier moves on in one sense in the direction at least approximately parallel to the reference axis, e.g. upwards. The movable part moves downwards relative to the carrier. The further movable part moves upwards relative to the carrier, due to the configuration of the force transfer device. The device driving movement of the carrier need only drive the movement of the carrier. All forces are directed at least approximately in parallel to the holding component path, and thereby the reference axis. This leads to an absence or at least near absence of torque on any of the parts of the suspension mechanism.

In a particular example of this embodiment, the force transfer device comprises a medium interconnecting the movable part and the further movable part and wrapped around a wheel rotatably journalled to the carrier.

The medium may be a cable, belt, wire, rope, chain or the like. In particular, the medium may be configured for positive engagement with the wheel. In that case, the wheel may be a gear and the medium may be a chain or toothed belt, for example. Positive engagement prevents slippage. The medium will in any case be flexible and configured for transferring a tensile force, such that movement of the movable part and the further movable part is linked. The number of turns of the medium around the wheel will generally be such that the movable part and further movable part move in opposite directions relative to the carrier.

In a particular embodiment of the device, the carriers, the suspension mechanism and the holding component form a planar linkage.

The object is therefore only able to move in a plane.

In an embodiment of the device, the reference axis is a first reference axis in a reference co-ordinate system further comprising a second reference axis perpendicular to the first reference axis, together defining a plane parallel to a plane in which the holding component path lies, and the device includes at least two carriers, guided for movement on opposite sides of the holding component seen in a direction parallel to the second reference axis.

The holding component may in this embodiment be an elongated holding component extending in a direction parallel to the second reference axis. The holding component is held at both ends, rather than taking the shape of an arm with a free end. This helps counter bending of the holding component that might lead to less accurate positioning of the object or even swinging of the object relative to the carrier.

In an example of this embodiment, the at least one support comprises a support frame supporting each of the at least two carriers.

This helps ensure that the paths of the carriers are relatively well-defined relative to one another, because the support frame can be relatively stiff. The respective paths of the carriers may in particular be essentially parallel linear paths.

In an embodiment of the device, the reference axis is a first reference axis in a reference co-ordinate system further comprising a second reference axis perpendicular to the first reference axis, together defining a plane parallel to a plane in which the holding component path lies, and the suspension mechanism is arranged to support the holding component on each of opposite sides of the plane in which the holding component path lies.

This helps counter rotation of the holding component about an axis in the plane. In the case of an essentially planar object, the plane of the object is kept in the intended plane in which the path lies relatively well.

In an embodiment of the device, the at least one device for controlling movement of at least one of the carriers comprises a linear actuator.

The carriers are thus driven along the path in a relatively simple way.

In a particular example of this embodiment, the linear actuator comprises a rotary motor and a mechanism for converting rotary motion into linear motion, wherein the rotary motor is arranged on the at least one support.

The assembly comprising the carrier(s) and the holding component is thus not weighed down by an electric motor.

In an embodiment of the device, the holding component path extends in a direction parallel to the reference axis beyond end points of the paths of the carriers proximal to the processing station, in use.

This ensures that the movement of the holding component relative to the carriers allows the holding component to be moved closer to the interior of the processing station than the carrier(s). The paths of the carrier(s) need not straddle the processing station, for example.

In an embodiment, the carriers and the suspension mechanism are located laterally adjacent the holding component with respect to the holding component path at an end point of the holding component path distal to the processing station, in use.

This further helps reduce the dimensions of the device in the direction of the reference axis. The end point of the holding component path distal to the processing station can be relatively close to the limit of the device in the direction of the reference axis, because no part of the carriers or the suspension mechanism is located between the holding component and that limit, seen in the direction of the reference axis.

According to another aspect, the system according to the invention for conveying an object comprising at least a substrate between processing stations of a processing apparatus comprises a transporter, movable along the processing stations, wherein the transporter comprises at least one device according to the invention.

The transporter carrying the object is able to clear barriers between adjacent processing stations or next to an opening through which the object is movable. The transporter can still be relatively compact in the direction of movement of the object into and out of each processing station. The system may in particular comprise at least two devices according to the invention. An effect is that the transporter can move to a processing station with a substrate to be processed, retrieve a substrate of which the processing in that processing station has finished and insert the substrate to be processed without first having to return the processed substrate at a station further along the line and retrieve the substrate to be processed. The processing station is left idle for a relatively short period and the number and length of the movements effected by the transporter is kept small.

An embodiment of the system comprises at least one guide for guiding movement of the transporter, wherein the holding component extends in a direction transverse to a direction of movement of the transporter.

In particular where the object comprising at least the substrate is planar, the plane of the object can extend in the direction transverse to the direction of movement of the transporter, so that the processing stations can each extend over a relatively short distance parallel to the direction of movement. The longest dimension of the holding component is in the direction transverse to the direction of movement of the transporter. Consequently, the apparatus can be compact in all dimensions.

An embodiment of the system comprises at least two guides for guiding movement of the transporter, arranged to support the transporter, and arranged on opposite sides of a plane through a centre of the holding component and parallel to the reference axis and the direction of movement of the transporter.

This helps keep the object comprising at least the substrate in its intended orientation relatively accurately.

An embodiment of the system comprises a system for inductive electrical power transfer to the transporter, arranged to supply electrical power to at least the at least one device for controlling the movement of at least one of the carriers.

The transporter is thus provided with a pick-up device, e.g. a shoe movable along a rail, in which pick-up device electrical current is induced, in use. This obviates the need to use cable carriers (also known as drag chains, energy chains, or cable chains) to provide power for the at least one device for controlling the movement of at least one of the carriers. The transporter can still have a relatively large range of movement.

According to another aspect, the apparatus according to the invention for processing a substrate comprises at least one of a device according to the invention and a conveying system according to the invention.

That is to say, the apparatus may be provided with at least one device for moving an object comprising at least a substrate, which device may or may not be comprised in a transporter of a system according to the invention. The apparatus is relatively compact.

In a particular embodiment, the apparatus comprises at least one processing station, open at a top, wherein the device for moving the object is arranged to raise the object out of and lower the object into at least one, e.g. each, processing station.

In this embodiment, the apparatus can have a relatively low height.

In an example of this embodiment, the at least one support of the device is arranged at a level above a top of the processing station(s).

The device therefore does not straddle the processing station, but extends over it. If the support is comprised in a transporter of a conveying system, then the transporter extends over the top of the processing station. This facilitates movement of the device, where provided, between processing stations. The fact that the device need not straddle the processing station also keeps the apparatus relatively compact and renders the processing stations easily accessible from the sides.

In an embodiment, the apparatus is a wet processing apparatus, at least one of the processing stations comprising a bath for receiving a processing liquid into which at least the substrate is submergible.

The device for moving the object comprising at least the substrate may in particular be arranged to lower at least the substrate into the bath and raise the substrate out of the bath again.

According to another aspect, the method of handling a substrate in a processing apparatus is characterised in that the holding component path is predominantly directed in parallel to the reference axis.

The method can be implemented with a relatively small addition to the extent of the processing apparatus in the direction of the reference axis.

In an embodiment of the method, the processing apparatus is a processing apparatus according to the invention.

Conversely, the device, system and processing apparatus according to the invention may be configured for implementing a method according to the invention.

BRIEF DESCRIPTION OF DRAWINGS

The invention will be explained in further detail with reference to the accompanying drawings, in which.

DESCRIPTION OF EMBODIMENTS

Figure 1:
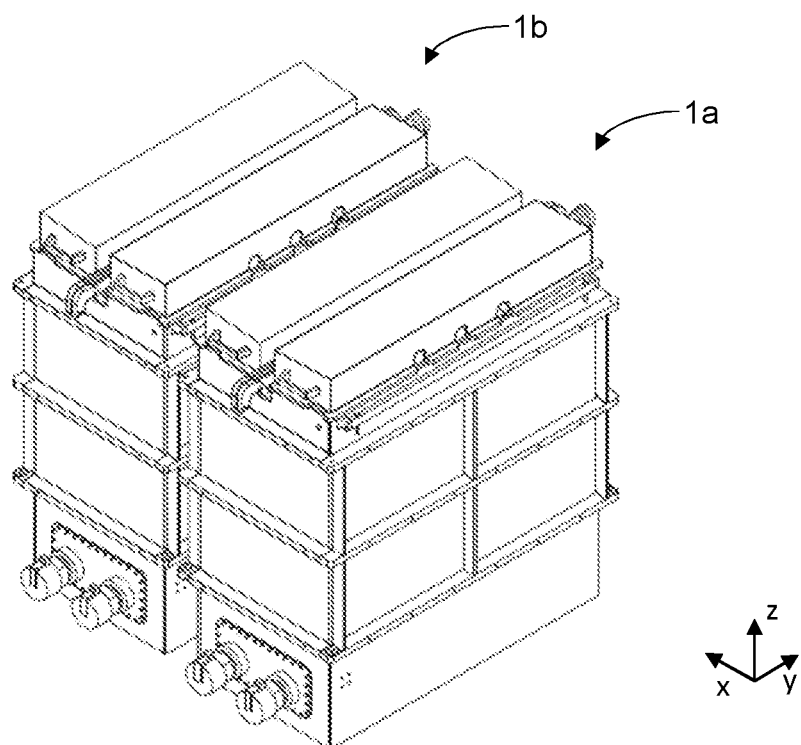
FIG. 1 is a perspective view of a row of processing stations in a processing apparatus.

A conveying system for use with a processing apparatus comprising a plurality of processing stations 1a,b (FIG. 1) will be described using the example of a vertical wet processing apparatus for planar substrates 2. The conveying system may, however, also be used in conjunction with other types of processing apparatus comprising a plurality of processing stations 1a,b arranged in a row and open on one side, e.g. at the top, to allow a substrate 2 to be inserted into and retracted from the processing station 1a,b, e.g. by lowering and raising the substrate 2.

Turning to the processing apparatus used here as an example, treatment of the substrate 2 in the apparatus may include at least one of chemical or electrolytic metal deposition, chemical or electrolytic etching and chemical or electrolytic cleaning. In a particular embodiment, the apparatus is arranged to carry out electrolytic metal deposition, chemical etching and chemical cleaning, with each of these steps taking place in a dedicated processing station 1a,b. Specifically contemplated examples of electrolytic metal deposition include galvanic deposition of copper or nickel onto a surface of a substrate 2.

Variants of the apparatus may be arranged for processing planar substrates 2 having a circular or polygonal (e.g. square or rectangular) shape. The substrate 2 may be a film or a semiconductor wafer, for example. Such a wafer may in particular have a frame-like structure obtainable by means of a so-called TAIKO process. In the illustrated example, a substrate 2 in the shape of a board is shown. The apparatus can be used to form electrically conductive traces on and/or or through the board, for example.

In the illustrated embodiment, the apparatus is a vertical plating apparatus, meaning that the substrate 2 is held in a generally vertical orientation during processing.

It is convenient to define a co-ordinate system with reference to the direction in which the processing stations 1a,b are arranged, an x-axis being parallel to this direction. The reference co-ordinate system is thus stationary. The substrate 2 is held with its plane essentially parallel to the zy-plane. The processing stations 1a,b can thus have a relatively large width, corresponding to their dimension in y-direction, and a shorter length, corresponding to their dimension in x-direction. A conveying system comprising a transporter 3 moves the substrate 2 from processing station 1a,b to processing station 1a,b.

Figure 3:
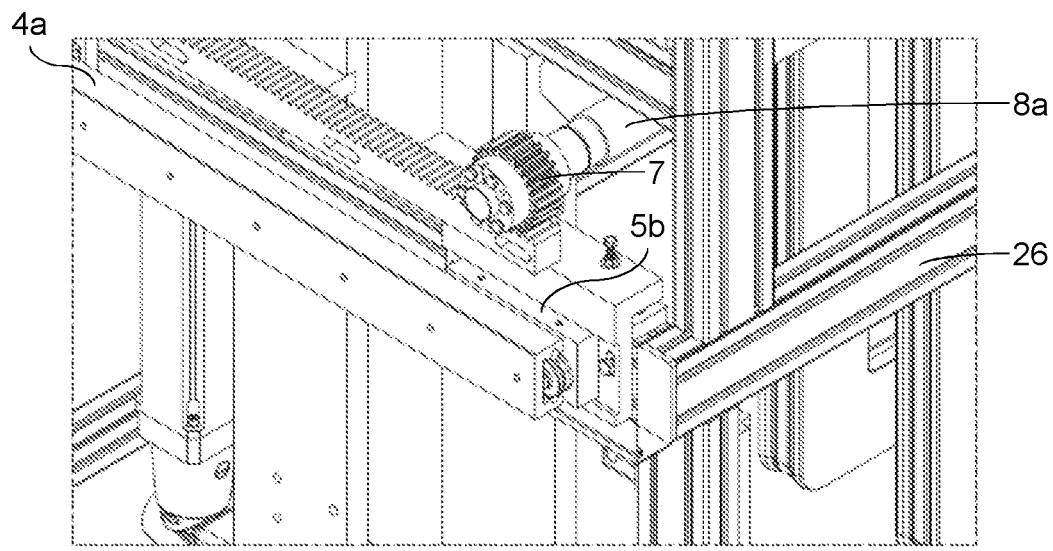
FIG. 3 is a detailed view of parts of a mechanism for moving a transporter of the conveying system along the processing stations.
Figure 4:
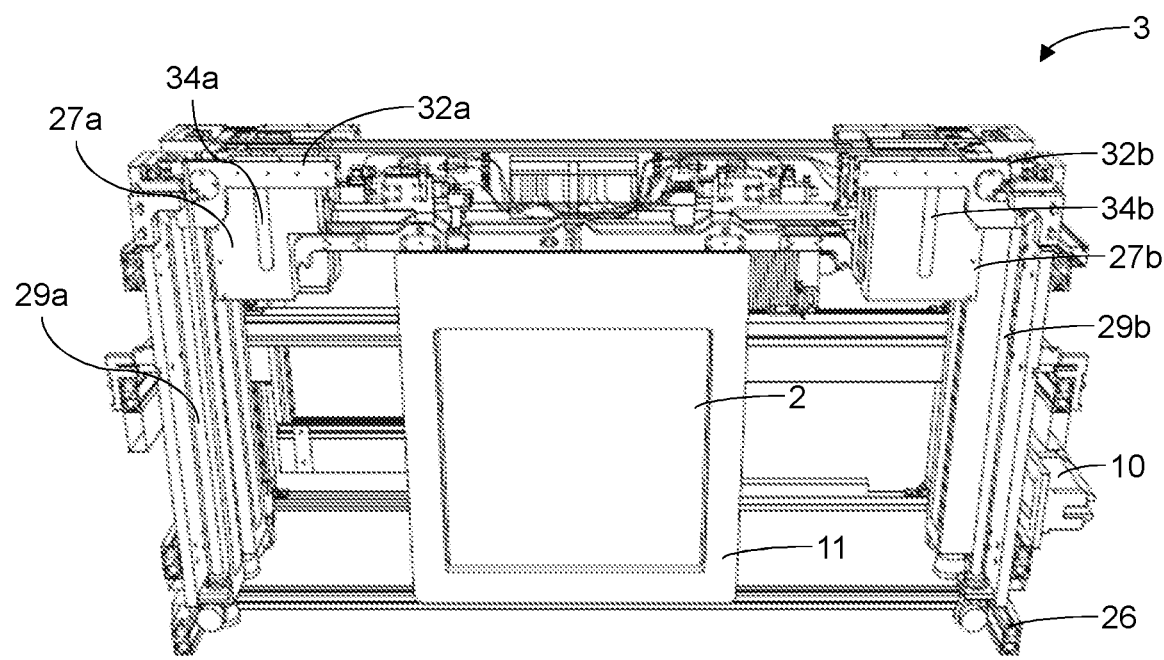
FIG. 4 is a perspective view of the transporter, showing a lifting device of the transporter in a raised position.
Figure 5:
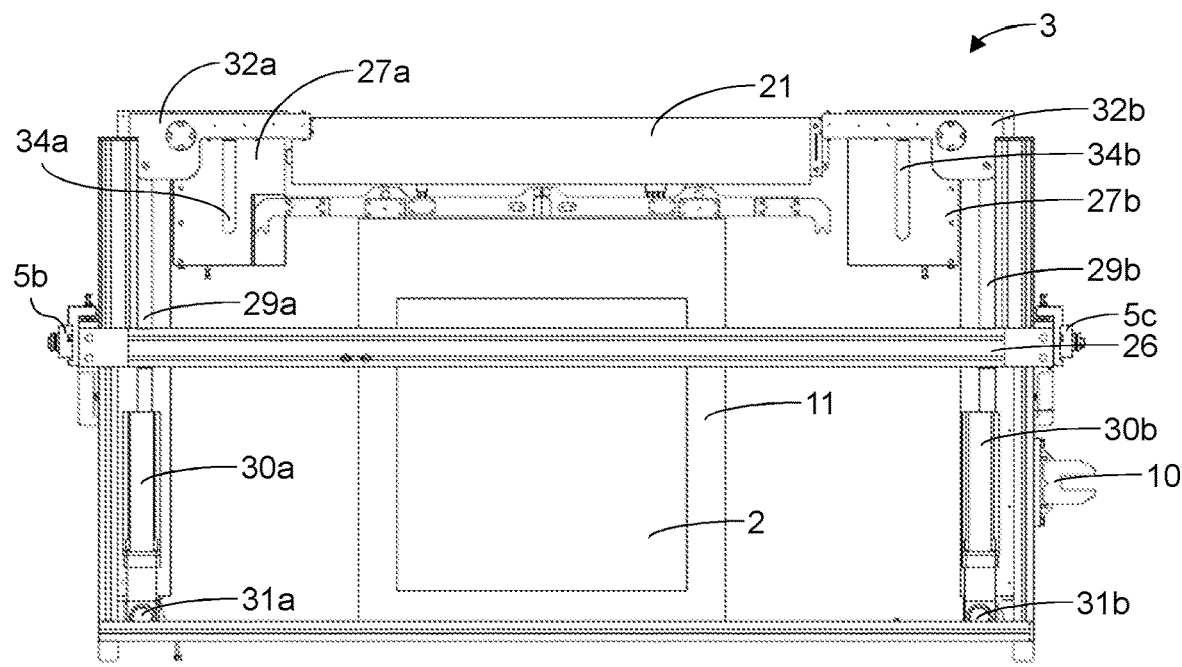
FIG. 5 is a plan view of the transporter, showing the lifting device in the raised position.
Figure 6:
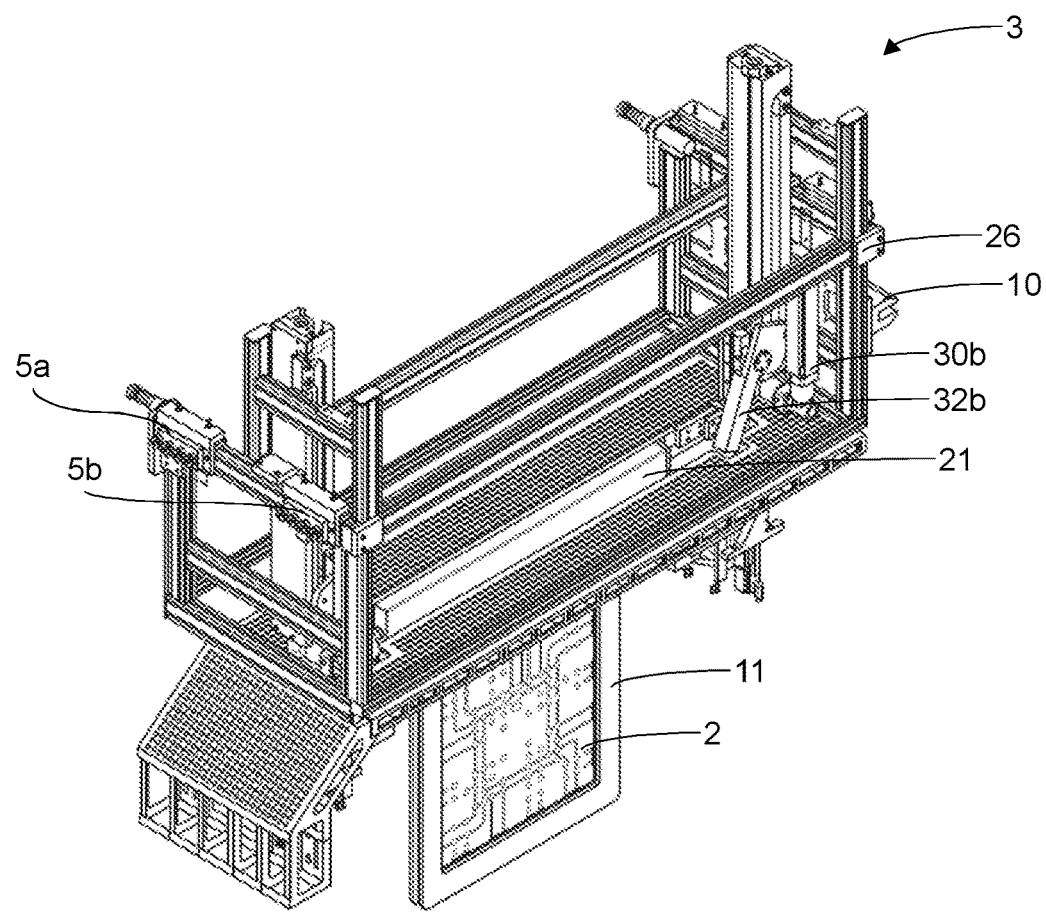
FIG. 6 is a perspective view of the transporter at a station, showing the lifting device in a lowered position.

To this end, transporter guide rails 4a,b extending in the direction of the x-axis are provided and carry travellers 5a-c (FIGS. 3 and 5) mounted on the transporter 3. Racks 6a,b extend in the direction of the x-axis on either side of the transporter 3. Pinions 7 (FIG. 3) are provided at the ends of axles 8a,b driven by a motor 9 comprised in the transporter 3. The transporter 3 is thus arranged for linear motion in either direction along the x-axis. A coupler shoe 10 forms part of a system for inductive power transfer to the transporter 3. This electrical power is used by the various actuators comprised in the transporter 3.

During processing, the substrate 2 is received in a substrate holder 11, so that the conveying system handles an object comprising the substrate 2 and the substrate holder 11. In this way, the conveying system need not repeatedly clamp and release the substrate 2. Damage to the substrate 2 is thereby avoided.

The substrate holder 11 shown in the example comprises two essentially identically shaped planar holding parts pressed against opposing major surfaces of the substrate 2. A section 12 of the substrate holder 11 for receiving the substrate 2 engages the substrate 2 in a border region of each of the two major surfaces of the substrate 2 along the entire perimeter of the substrate 2. The substrate holder 11 leaves a central region of each major surface exposed. The substrate holder 11 thus frames the substrate 2 on each side of the substrate 2. It is possible to use a substrate holder 11 that completely covers one of the two major surfaces of the substrate 2 instead, depending on the intended application.

Figure 10:
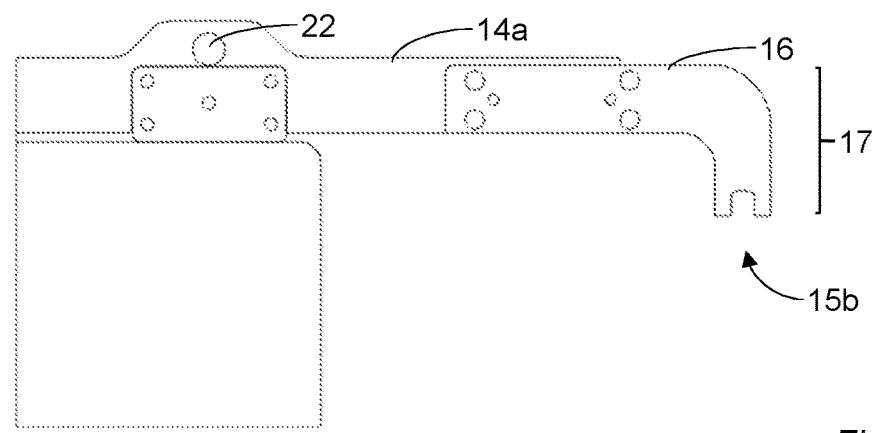
FIG. 10 is a detailed view of an end section of part of a substrate holder.
Figure 11:
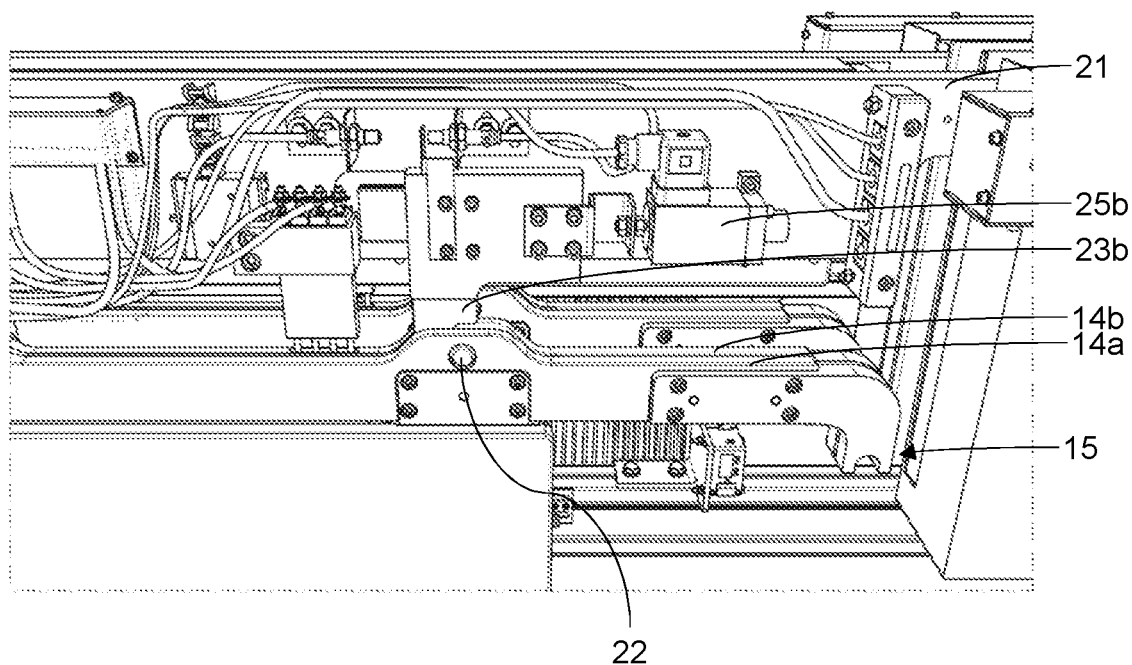
FIG. 11 is a detailed view of an engagement feature of the lifting device engaging the substrate holder.
Figure 12:
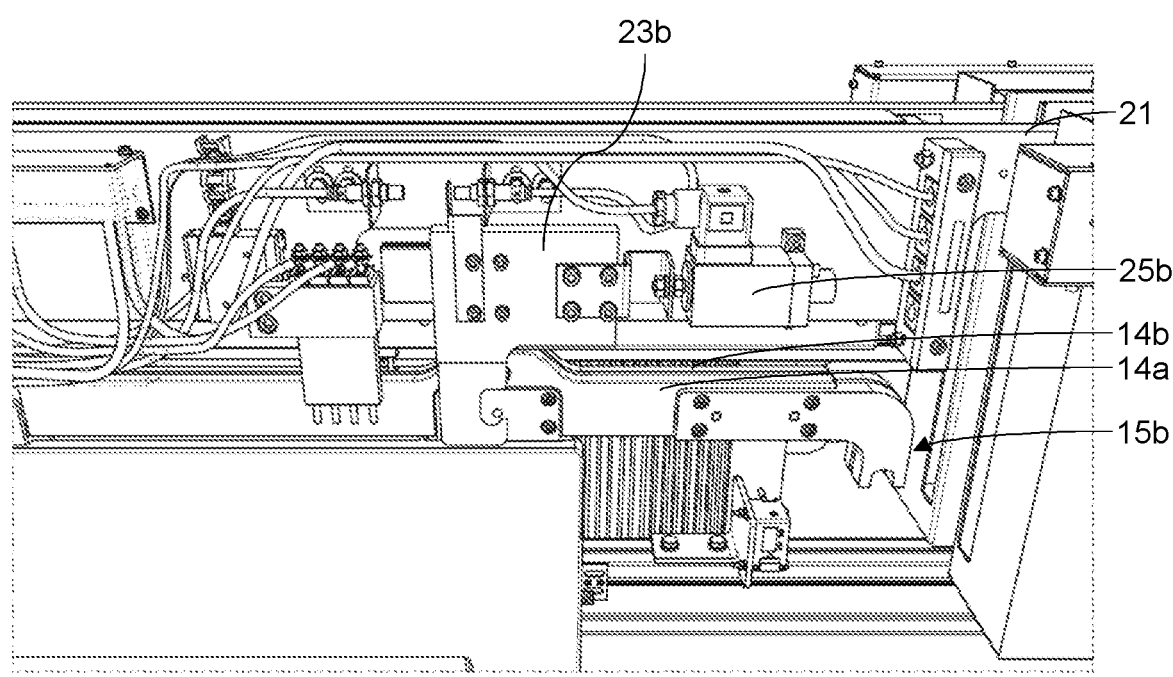
FIG. 12 is a second detailed view of the engagement feature of FIG. 11.

The substrate holder 11 further comprises a support part, in this case a support assembly 13 provided with features for engaging the substrate holder 11. The support assembly 13 in this example comprises two parallel bars 14a,b. These bars 14a,b extend essentially in a plane of the substrate holder 11. The support assembly 13 projects laterally in opposite directions with respect to the substrate holding parts between which the substrate 2 is held. Engagement features are provided on the projecting sections of the support assembly 13 for engaging the support assembly 13 on either side of the substrate 2 from a direction in which the substrate 2 extends relative to the support assembly 13. In the illustrated embodiment, the engagement features comprise claws 15a,b for receiving respective pins oriented with a longitudinal axis transverse to the plane of the substrate 2. In the illustrated embodiment, the claws 15a,b are formed at the end of angled extensions 16 to the substrate holder support bars 14a,b. In alternative embodiments, the claws 15a,b or similar recesses may be formed directly in an underside of the support bars 14. An end section 17 (FIG. 10) extends in a same direction relative to the substrate holder support bars 14a,b as the section 12 for receiving the substrate 2.

Within at least one processing station 1a,b, the substrate holder 11 is held by opposing carrier assemblies 18a,b. Each carrier assembly 18a,b comprises a pin 19 (FIG. 14) extending between a pair of parts presenting opposing surface sections facing in an axial direction with respect to a longitudinal pin axis. The pin 19 and a claw 15b thus form interlocking engagement features that allow essentially no movement of the substrate holder 11 in the x-direction, the direction transverse to the plane of the substrate 2. The pin 19 comprises flanges 20a,b at either end. The claw 15b is inserted between the flanges 20a,b to engage the pin 19. Opposing surface sections defined by the flanges 20a,b at either end of the pin 19 thus limit movement of the substrate holder 11 relative to the carrier assemblies 18a,b in the y-direction. The engagement features are held in engagement through the force of gravity. The substrate holder 11 need only be lifted out of the processing station 1a,b to cause the engagement features to disengage.

In this manner, the end sections, in the form of the angled extensions 16, are provided with features, in the form of the claws 15a,b, for engaging supports, in the form of the carrier assemblies 18a,b, in the processing stations 1a,b. The claws 15a,b interlock with features, in the form of the pin 19 and flanges 20a,b, to prevent relative movement in the y-direction, the direction in which the carrier part in the form of the support assembly 13 extends.

In an embodiment, at least one of the carrier assemblies 18a,b comprises at least one actuator for moving the substrate holder 11 and thus the substrate 2 in a plane of the substrate 2. This movement may be in multiple dimensions. The movement complements or replaces agitation of the fluid in which the substrate 2 is submerged for processing. An example of the kind of movement contemplated, and a description of its effects, is provided in WO 2017/093382 A1.

The conveying system comprises a transporter 3 comprising a holding component 21 for carrying the substrate holder 11. To this end, the substrate holder 11 is provided with further engagement features for interlocking engagement with co-operating engagement features of the holding component 21. The engagement features of the substrate holder 11 are provided at two distinct locations along the substrate holder support bars 14a,b. This essentially precludes any rotation of the substrate holder 11 about the z-axis during handling by the conveying system. The provision of engagement features at two distinct locations also helps prevent any swinging of the substrate holder 11 in a plane of the substrate 2. As a consequence, the engagement features—in this example the claws 15a,b—arranged for interlocking engagement with the engagement features—in this example the pin 19—of the carrier assemblies 18a,b can be aligned relatively accurately when the substrate holder 11 is lowered into the processing station 1a,b.

Figure 13:
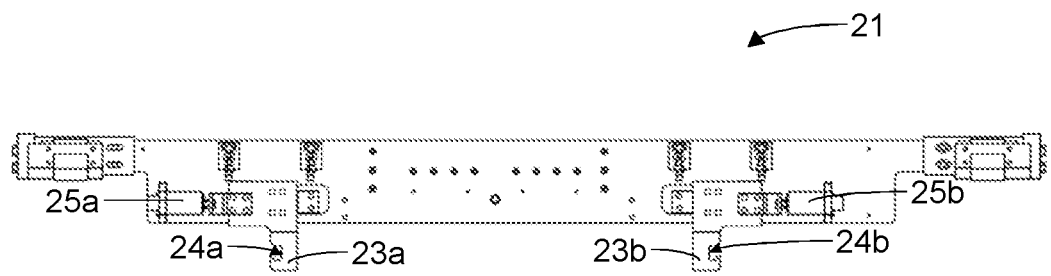
FIG. 13 is a plan view of a holding component of the lifting device.
Figure 14:
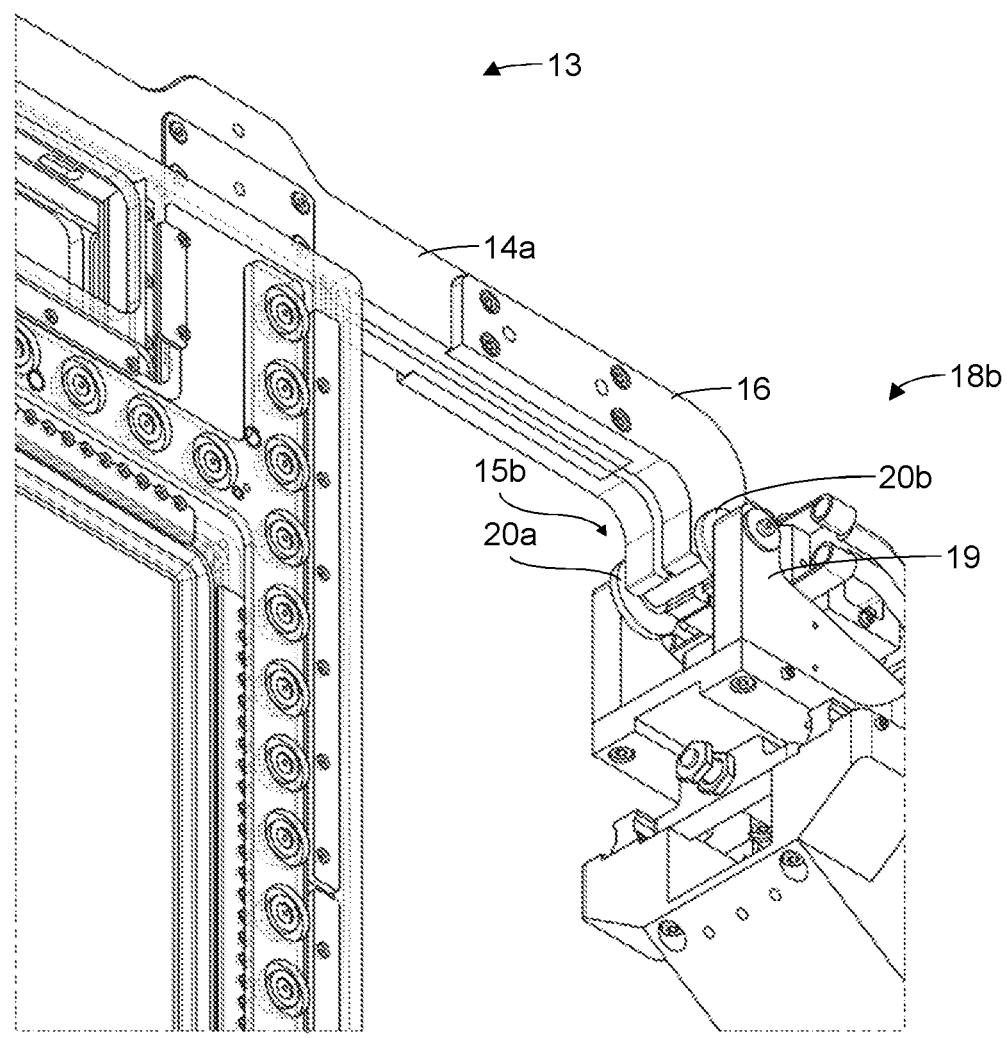
FIG. 14 is a detailed perspective view of the substrate holder supported by one of a pair of carrier assemblies of a processing station.

In the illustrated embodiments, the engagement features of the substrate holder 11 comprise features behind which movable engagement features of the holding component 21 can hook to allow the engagement features to interlock. In particular, the engagement features of the substrate holder 11 comprise pins 22 (FIGS. 10-12 and 14) extending between the substrate holder support bars 14a,b. The engagement features of the holding component 21 comprise hooks 23a,b movably journalled to the holding component 21. The hooks 23a,b are open in opposite lateral directions (FIG. 14). The hooks 23a,b are moved in opposite directions along the y-axis to engage the pins 22 by means of inside edge sections 24a,b (FIG. 13) of the hooks 23a,b. In this way, once engaged with the pins 22, relative movement of the substrate holder 11 with respect to the holding component 21 is essentially prevented. The hooks 23a,b are moved into engagement by respective actuators 25a,b with which the holding component 21 is provided. The holding component 21 may comprise engagement features with a different shape in other embodiments, as long as they are movable in the y-direction to hook behind engagement features of the substrate holder 11. In this way, the substrate holder 11 is supported by the engagement features of the holding component 21 when suspended from the holding component 21.

Figure 2:
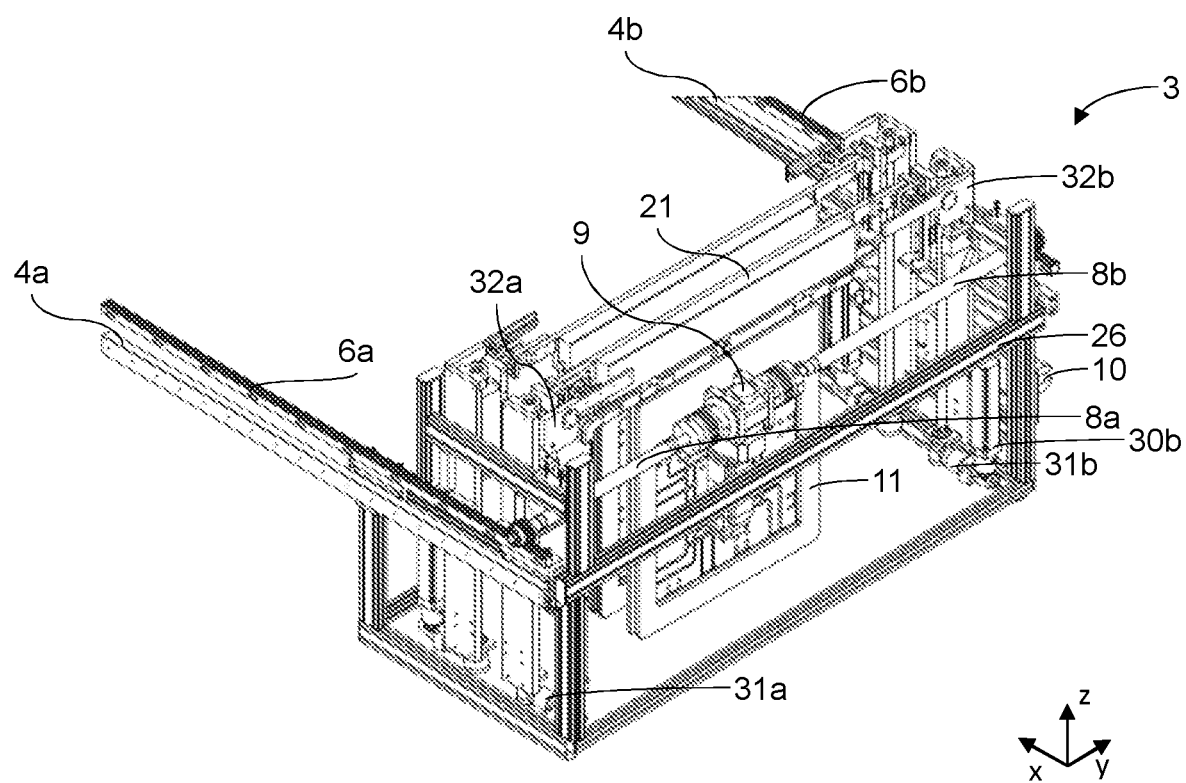
FIG. 2 is a perspective view of parts of a system for conveying an object comprising a substrate between processing stations.

The transporter 3 of the first embodiment (FIGS. 1-14) comprises two lifting devices (FIG. 2). Each lifting device comprises a respective holding component 21. The following description will focus on only one of the lifting devices. The other is a mirror image.

The transporter 3 comprises a frame 26 forming a support relative to which the holding component 21 is movable upwards and downwards in z-direction.

Figure 7:
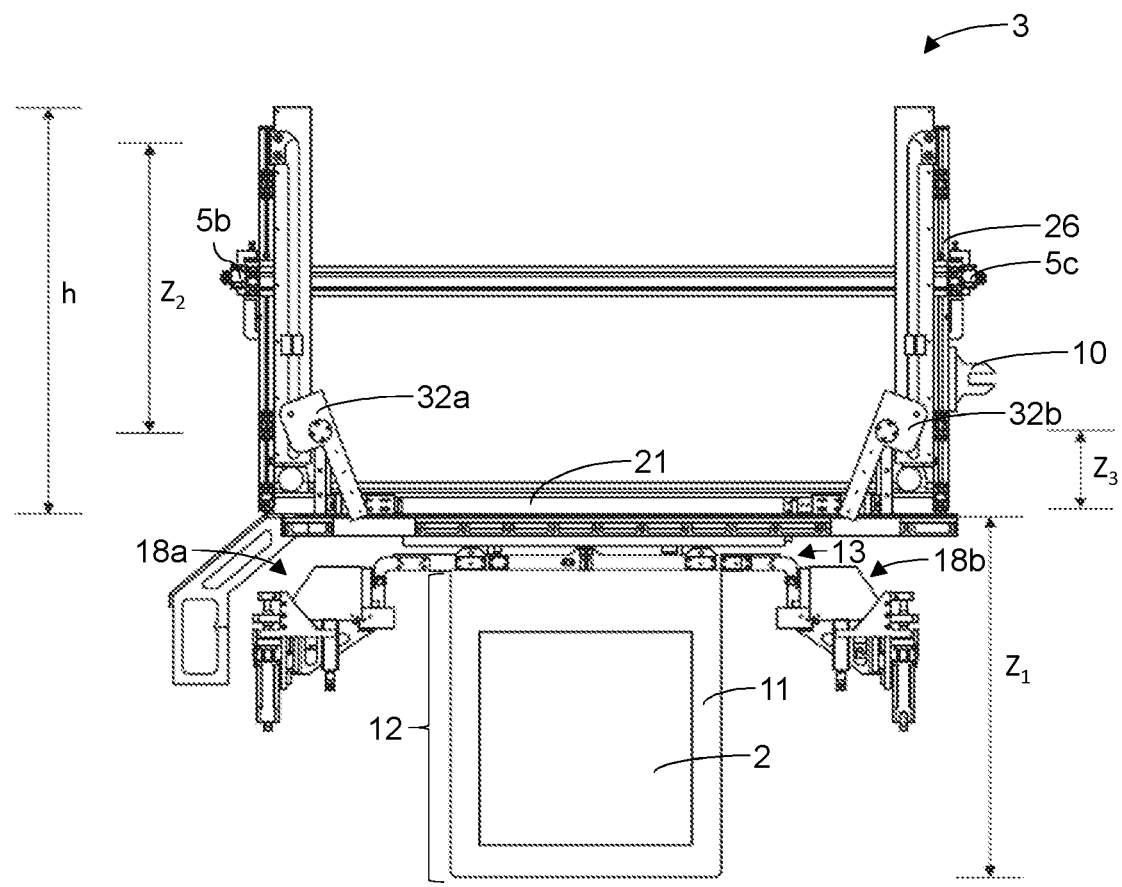
FIG. 7 is a plan view of the transporter, showing the lifting device in the lowered position.
Figure 8:
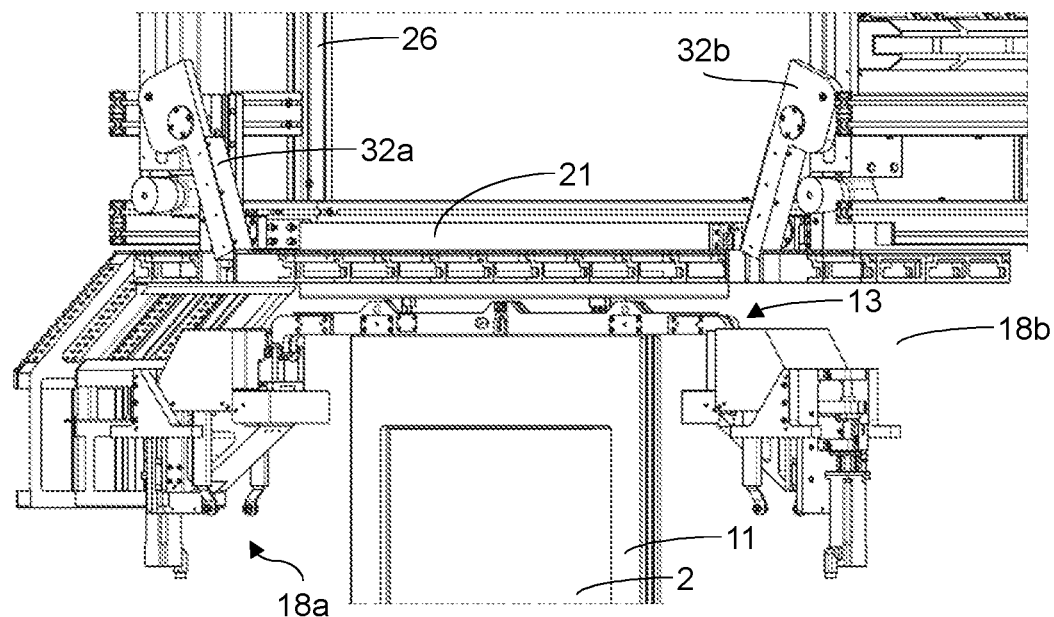
FIG. 8 is a detailed perspective view of the transporter, showing the lifting device in the lowered position.
Figure 9:
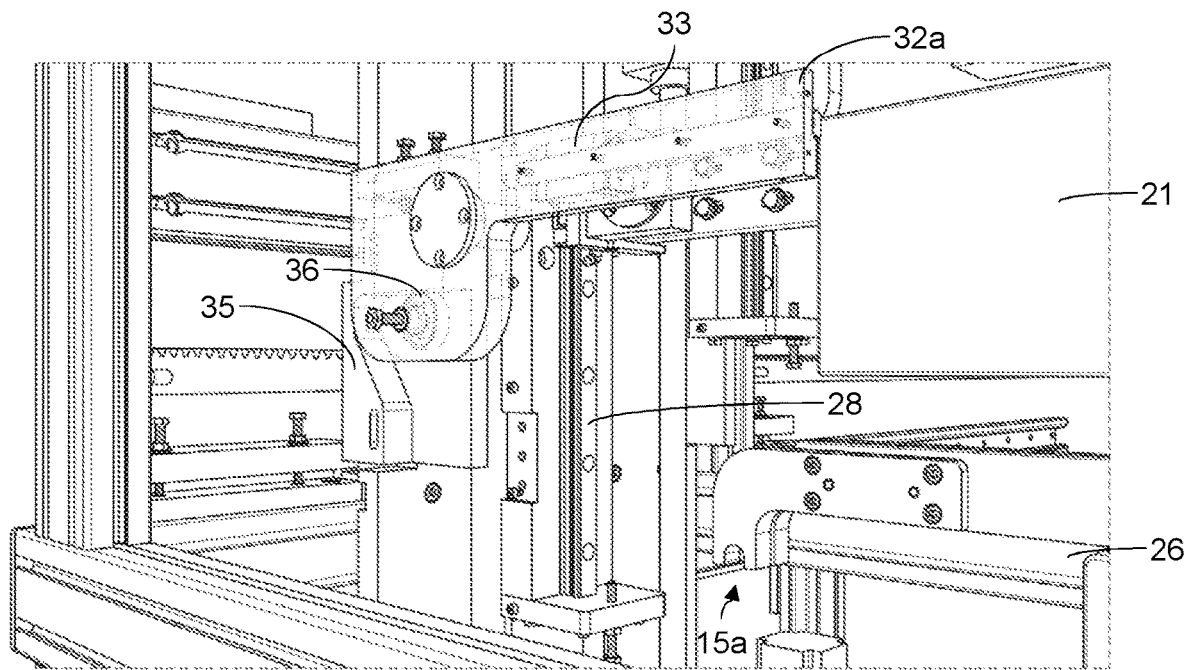
FIG. 9 is a detailed, partially transparent view of a lever comprised in a suspension mechanism of the lifting device.

The lifting device is arranged to lift the holding component 21 and the substrate holder 11 completely out of each processing station 1a,b, so that the substrate holder 2 is held clear of any obstructions on the way to the next processing station 1a,b in x-direction. The extent of the displacement of the substrate holder 11 is indicated for illustrative purposes as $Z_1$ (FIG. 7). The distance $Z_1$ is the sum of a displacement distance $Z_2$ in the z-direction by two carriers 27a,b relative to the frame 26 and a displacement distance $Z_3$ of the holding component 21 relative to the carriers 27a,b. In this way, the frame 26 need only have a height h sufficient to accommodate the displacement distance $Z_2$ of the carriers 27a,b. If the holding component 21 were not movable relative to the carriers 27a,b in z-direction, the height h would need to be sufficient to accommodate a displacement of the carriers 27a,b equal to the displacement distance $Z_1$ of the substrate holder 11.

In the illustrated embodiment, the frame 26 extends in y-direction, i.e. essentially parallel to the plane in which the substrate 2 is held. In alternative embodiments, a respective support is provided on each side of the holding component 21, with the holding component 21 suspended between those supports. The illustrated variant employing a frame with multiple cross-bars extending in y-direction at different respective levels helps ensure that the displacement path of the carriers 27a,b is relatively accurately determined.

Each carrier 27a,b comprises a guide 28 (FIG. 9) for guiding movement of the holding component 21 relative to the carrier 27a,b in the z-direction. Each carrier 27a,b is itself guided for movement in the z-direction relative to the transporter frame 26. A pair of linear actuators is provided for controlling movement of the carrier 27a,b upwards and downwards in the z-direction. The linear actuator may be an electro-mechanical actuator, for example. Pneumatic or hydraulic actuators are also possible in principle, but require space for a piston. Linear actuators employing a motor and screw mechanism are relatively well-suited. The illustrated example makes use of a lead screw 29a,b having an axis of rotation extending essentially in the z-direction and rotatably journalled on the transporter frame 26. Rotary motors 30*a,b* are arranged to drive the lead screws 29*a,b* via transmission mechanisms 31*a,b*. The lead screws 29*a,b* guide movement of the carriers 27*a,b*, which travel along the lead screws 29*a,b*. The motors 30*a,b* thus remain stationary with respect to the transporter 3.

With this type of linear actuator, the longest element of the mechanism, namely the lead screw 29*a,b* is not displaced in z-direction. Alternatives with a similar effect include linear actuators comprising a mechanism comprising a rack and pinion, a belt drive or a winch. In the latter two alternatives, as is the case for the screw mechanism with rotating screw, the carriers 27*a,b* need not comprise the electric motors, which are instead supported by the frame.

The carriers 27*a,b* are provided with a pair of pivots on which levers 32*a,b* are pivotably arranged. In the illustrated embodiment, the levers 32*a,b* are first-class levers with unequal arm lengths. Travellers 33 (FIG. 9) are arranged for movement along the longer of the two arms. These travellers 33 are connected to the holding component 21 through guide slots 34*a,b* oriented in the z-direction.

Abutments 35 (FIG. 9) are provided at a level corresponding to an end of the range of movement of the carriers 27*a,b* in the path of the levers 32*a,b*. Followers 36 of the levers 32*a,b* at free ends of the levers 32*a,b* hit the abutments 35 as the carriers 27*a,b* are raised by the linear actuators. This causes the levers 32*a,b* to pivot and thus to drive the holding component 21 upwards in z-direction relative to the carriers 27*a,b*.

In alternative embodiments, a different type of transmission mechanism enables the linear actuators driving movement of the carriers 27*a,b* relative to the transporter frame 26 also to drive the movement of the holding component 21 relative to the carriers 27*a,b*. An example would be a rack and pinion mechanism, with the pinion carried by the carrier 27*a,b* and connected to a winch, optionally via gears, to wind and unwind a cable connected to the holding component 21, for example. Another possibility is a pantograph mechanism in combination with an abutment arranged to arrest movement of a pivot connecting two links.

Figure 15:
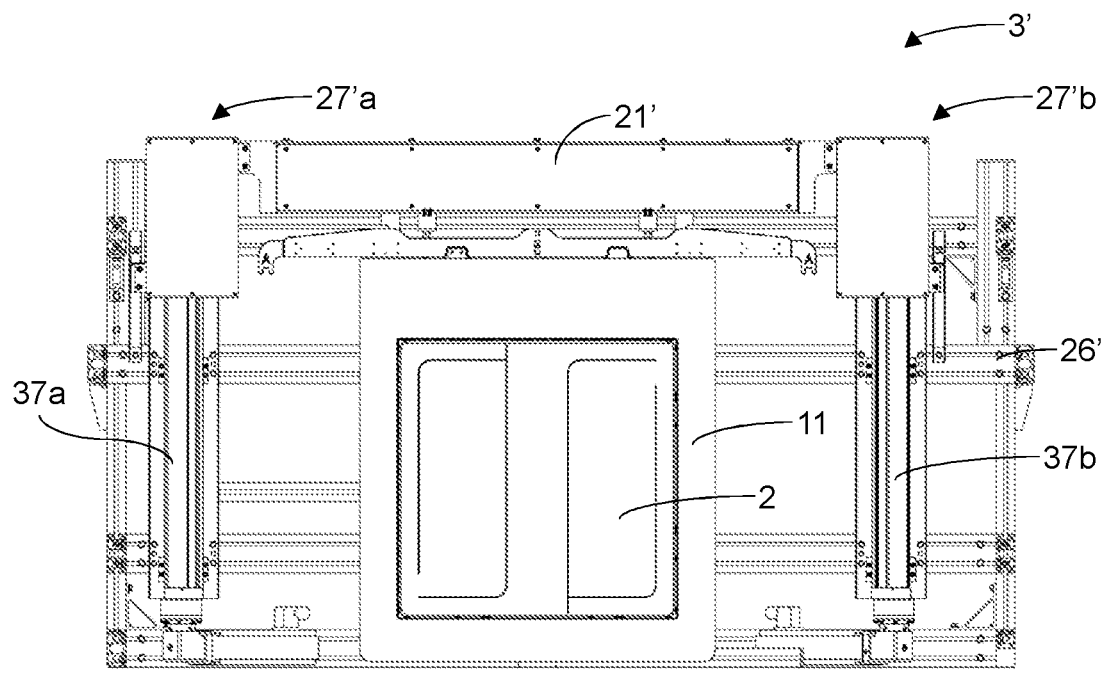
FIG. 15 is a plan view of a frame and lifting device of a second embodiment of the transporter, with the lifting device in a raised position.
Figure 16:
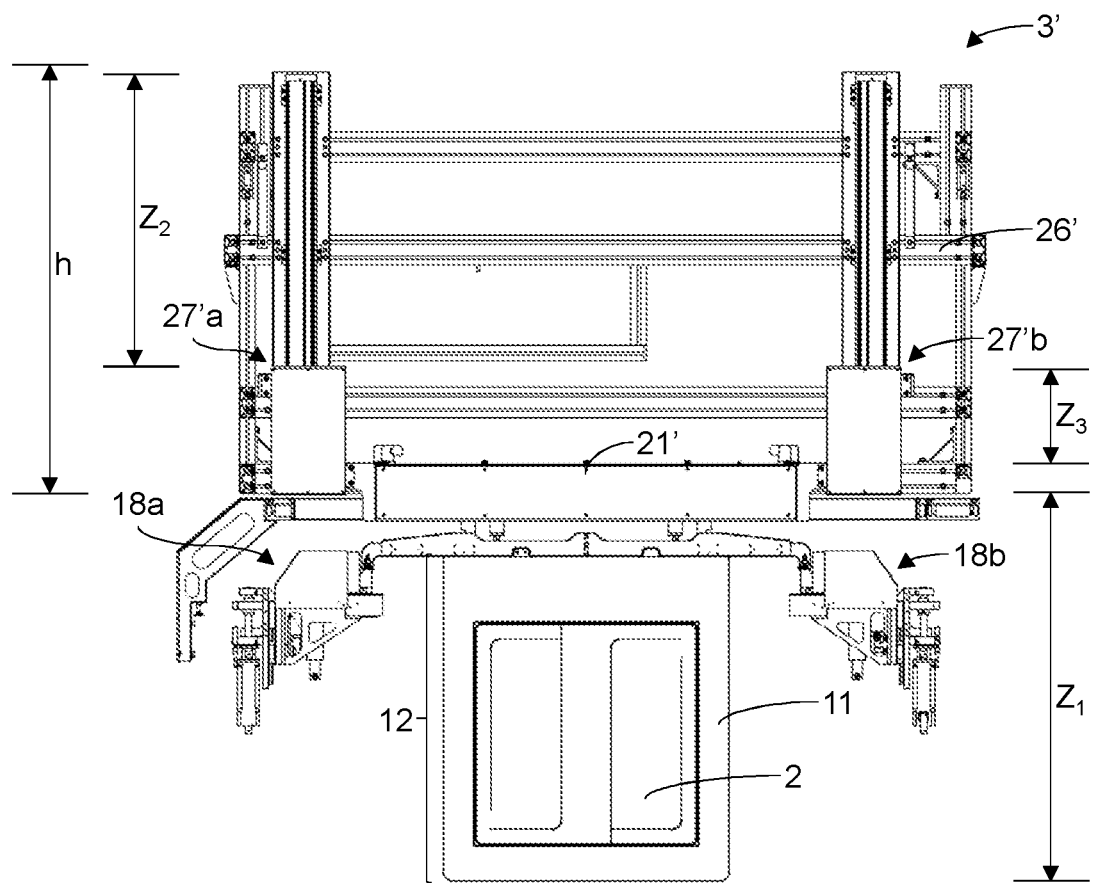
FIG. 16 is a plan view of the frame and lifting device of the second embodiment with the lifting device in the lowered position.

A further example is provided by a second embodiment (FIGS. 15-17) described here using like reference numerals for like parts.

In the second embodiment, the substrate holder 11 is that of the first embodiment (FIGS. 1-14). Reference is made to the description of the substrate holder 11 provided above. The holding component 21' is substantially the same as the holding component 21 of the first embodiment, except for the connections to the lifting devices at the ends of the holding component 21' (seen in y-direction). Otherwise, the description provided above of the engagement features of the holding component 21 applies equally to the holding component 21' of the second embodiment and is not repeated here.

In the second embodiment, the transporter 3' also comprises a frame 26' forming a support. This frame 26' is placeable at one of the processing stations 1*a,b* by the transporter 3'.

Carriers 27'*a,b* are guided for movement relative to the frame 26' in the z-direction. Linear actuators 37*a,b* form respective devices for controlling movement of the carriers 27'*a,b*, in particular driving movement of the carriers 27'*a,b* in the z-direction. Each linear actuator 37*a,b* may be an electro-mechanical actuator, for example. Pneumatic or hydraulic actuators are also possible in principle, but require space for a piston. Linear actuators 37*a,b* employing a motor and screw mechanism are relatively well-suited. Thus, use may be made of a lead screw having an axis of rotation extending essentially in the z-direction and rotatably journalled on the transporter frame 26', with rotary motors being arranged to drive the lead screws via respective transmission mechanisms, as in the first embodiment. Examples of such linear actuators 37*a,b* are also referred to as ball screw assembly or planetary screw assembly and available as off-the-shelf parts.

As in the first embodiment, the displacement $Z_1$ of the substrate holder 11' is the sum of a displacement distance $Z_2$ in the z-direction of the two carriers 27'*a,b* relative to the frame 26' and a displacement distance $Z_3$ of the holding component 21' relative to the carriers 27'*a,b* in the z-direction. In this way, the frame 26' need only have a height h sufficient to accommodate the displacement distance $Z_2$ of the carriers 27'*a,b*. If the holding component 21' were not movable relative to the carriers 27'*a,b*, the height h would need to be sufficient to accommodate a displacement of the carriers 27'*a,b* equal in extent to the displacement distance $Z_1$ of the substrate holder 21'. This is because the lower edge of the substrate holder 11 must be raised to about the lower level of the frame 26' for the transporter 3' to be able to move unobstructed in x-direction.

Figure 17:
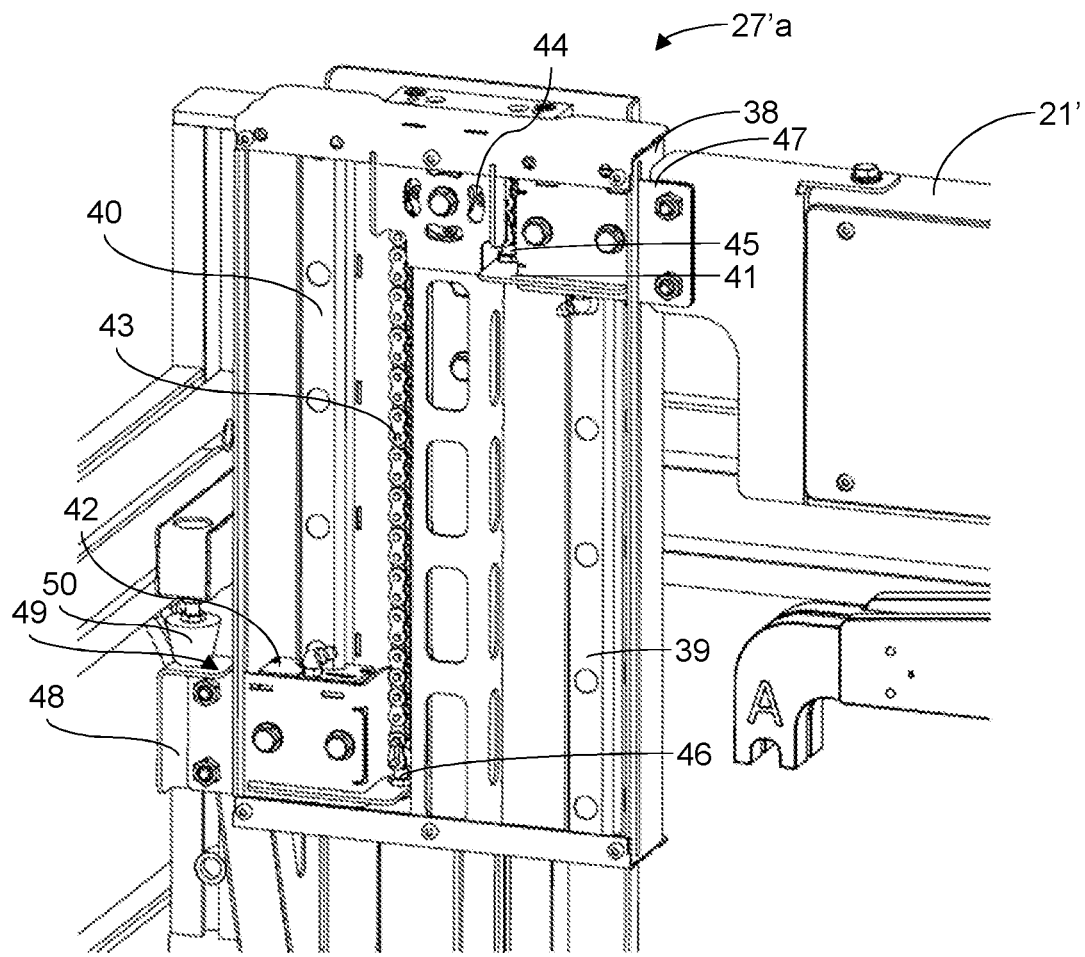
FIG. 17 is a detailed view of a carrier comprised in the lifting device of the second embodiment, with part of a housing of the carrier omitted.

The holding component 21' is connected to the carriers 27'*a,b* by a suspension mechanism, comprising an assembly at either end of the holding component 21', seen in y-direction. Only the assembly of a first carrier 27'*a* of the two carriers 27'*a,b* is shown in detail (FIG. 17). The second carrier 27'*b* is of the same construction, except that the assembly is a mirror image of the illustrated assembly. The suspension mechanism is arranged to guide movement of the holding component 21' along a holding component path relative to the carriers 27'*a,b*. The holding component path extends essentially in z-direction.

The first carrier 27'*a* comprises a carrier housing 38 and first and second guides 39,40 on which first and second carriages 41,42 are arranged to run. In the second embodiment, the first and second guides 39,40 are linear guides, oriented at least approximately in z-direction. The first and second carriages 41,42 are provided with ball bearings (not shown) by which they are supported on the first and second guides 39,40. Roller bearings or magnetic bearings may be used in variants of the second embodiment. The first guide 39 and the first carriage 41 form a slide mechanism, as do the second guide 40 and the second carriage 42. Alternative linear motion guide mechanisms may be used, e.g. one replacing the first and second guides 39,40 by profiles forming channels in which rollers comprised in one or more carriages are arranged to run.

The first carrier 27'*a* further comprises a chain 43 and sprocket 44. The chain 43 interconnects the first and second carriages 41,42. The sprocket 44 is rotatably mounted to the carrier 27'*a*. The chain 43 may be a roller chain, for example. Another medium wrapped around a wheel for transferring a force between the first and second carriages 41,42 could also be used, e.g. one engaging the wheel by friction rather than via positive engagement, such as a rope, belt or cable. However, positive engagement between the wheel and the force transfer mechanism prevents slipping. Since there are two carriers 27'*a,b*, this helps keep the holding component 21' level.

In embodiments, the displacement distance $Z_3$ of the holding component 21' relative to the first carrier 27'*a* can be fine-tuned. To this end, a connecting device is provided at one or each end of the chain 43, which connecting device has an adjustable length between a point of attachment to the chain 43 and a point of attachment to a part to which the chain 43 is connected by the connecting device. This other part may be one of the first and second carriages 41,42 or a mounting device attached to that carriage, for example. The connecting device may comprise co-operating threaded parts enabling the length to be adjusted. In the illustrated embodiment, first and second connecting devices 45,46 are provided.

The longitudinal end of the holding component 21' (seen in y-direction) is attached to the first carriage 41 via a first mounting plate 47. The first mounting plate 47 extends through a slot in the carrier housing 38. The first mounting plate 47 is arranged to move within this slot, which can be relatively narrow and thus form only a small aperture in the carrier housing 38.

The second carriage 42 is connected to a second mounting plate 48, which also extends through a slot in the carrier housing 38 and is arranged to travel within this slot. The second mounting plate 48 presents an abutment surface 49. The abutment surface 49 co-operates with an abutment 50 mounted on the frame 26' to arrest movement of the second carriage 42 as the first carrier 27'a is moved in z-direction in the direction of withdrawal of the substrate carrier 11 from a processing station 1a,b. The assembly of the second carriage 42 and the second mounting plate 48 forms a part movably journalled to the first carrier 27'a. The first carrier 27'a is guided for movement past the abutment 50. The abutment 50 forms a feature arranged to engage the movable part (i.e. the second carriage 42 and the second mounting plate 48) from a certain position along the path of the first carrier 27'a along the frame 26'. This certain position may be adjustable, and one example of how this adjustment is achieved will be given below. The arrangement of the first and second carriages 41,42, chain 43 and sprocket 44 forms a mechanism for translating movement of the second carriage 42 relative to the first carrier 27'a into movement of the holding component 21' relative to the first carrier 27'a. This arrangement is replicated in the second carrier 27'b.

The first and second carriers 27'a,b, the holding component 21' and the suspension mechanism holding the holding component 21' between the first and second carriers 27'a,b are located at least approximately in a plane parallel to the z- and y-direction, such that they form a planar linkage. The first and second carriers 27'a,b are guided for movement on opposite sides of the holding component 21', seen in the y-direction. The linear actuators 37a,b are adjustable in position in x-, y- and z-direction relative to the frame 26'. The displacement distance $Z_2$ of the first carrier 27'a is further adjustable by adjusting the position of the abutment 50 relative to the frame 26', as alluded to above.

Compared to the first embodiment, the second embodiment avoids relatively large amounts of torque in the application of the lifting force. The lifting force is applied in an essentially parallel direction to the weight of the substrate holder 11. Also, the carriers 27'a,b need comprise only a few or no bespoke component parts. The first and second carriages 41,42 may be off-the-shelf parts and the first and second guides 39,40 can be cut from standardised extruded profiles, for example. Furthermore, the carrier housing 38 can be relatively closed, so that there is less risk of contamination by particles due to abrasive wear.

Nevertheless, in each embodiment, the range of movement of the holding component 21;21' relative to the carriers 27a,b;27'a,b along the z-axis shortens the required range of movement of the carriers 27a,b;27'a,b relative to the transporter frame 26;26' along the z-axis, and thus decreases the height h that the transporter 3 must have.

The invention is not limited to the described embodiments, but may be varied within the scope of the accompanying claims. The pivoting movement of the levers 32a,b of the first embodiment need not be in a plane parallel to the plane of the substrate 2, for example, as long as the movement of the substrate 2 is in a single plane.

LIST OF REFERENCE NUMERALS 1a,b—processing stations
2—substrate
3; 3'—transporter
4a,b—transporter guide rails
5a-c—transporter travellers
6a,b—racks
7—pinion
8a,b—axles
9—transporter motor
10—coupler shoe
11—substrate holder
12—substrate holder section
13—support assembly
14a,b—support bars
15a,b—claws
16—bar extension
17—extension end section
18a,b—carrier assembly
19—carrier assembly pin
20a,b—pin flanges
21—holding component
22—substrate holder pin
23a,b—holding component hook
24a,b—inside edge sections
25a,b—holding component actuator
26; 26'—transporter frame
27a,b; 27'a,b—carriers
28—holding component guide
29a,b—lead screws
30a,b—rotary motors
31a,b—linear actuator transmission mechanisms
32a,b—levers
33—traveller
34a,b—guide slots
35—abutment
36—follower
37a,b—linear actuators
38—carrier housing
39—first guide
40—second guide
41—first carriage
42—second carriage
43—chain
44—sprocket
45—first connecting device
46—second connecting device
47—first mounting plate
48—second mounting plate
49—abutment surface
50—abutment

The invention claimed is:
1. A device for moving an object comprising at least a substrate (2) through an open side of a processing station (1a,b) of a processing apparatus, the device comprising:
at least one support (26;26'), placeable at the processing station (1a,b);
at least one carrier (27a,b;27'a,b), each guided for movement relative to the at least one support (26;26') along a respective path predominantly directed in parallel to a reference axis (z) in a three-dimensional reference co-ordinate system; at least one controlling device (29*a,b*,30*a,b*,31*a,b*;37*a,b*) for controlling the movement of the at least one carrier (27*a,b*;27'*a,b*) and driving the movement in at least one of opposite directions along the respective path;

a holding component (21;21') for holding the object; and a suspension mechanism with which the holding component (21;21') is connected to the at least one carrier (27*a,b*;27'*a,b*);

wherein the suspension mechanism is arranged to guide movement of the holding component (21;21') relative to the at least one carrier (27*a,b*;27'*a,b*) along a holding component (21;21') path; and wherein the at least one controlling device (29*a,b*,30*a,b*, 31*a,b*;37*a,b*) is arranged to drive the movement of the holding component (21;21') in at least one direction along the holding component path, characterised in that the holding component path is predominantly directed in parallel to the reference axis (z).

2. The device according to claim 1, wherein the at least one controlling device (29*a,b*,30*a,b*,31*a,b*;37*a,b*) for controlling the movement of at least one of the carriers (27*a, b*;27'*a,b*) is also arranged to drive the movement of the holding component (21;21').

3. The device according to claim 2, wherein the at least one carrier (27*a,b*;27'*a,b*) is provided with a movable part (32*a,b*;42,48) movably journalled to the at least one carrier (27*a,b*;27'*a,b*);

wherein the at least one carrier (27*a,b*;27'*a,b*) is guided for movement the at least one support (26;26') past a feature (35;50) arranged to engage the movable part (32*a,b*;42,48) from at least a certain position along the path of the at least one carrier (27*a,b*;27'*a,b*) along the support (26;26'); and wherein the suspension mechanism comprises a mechanism for translating movement of the movable part (32*a,b*;42,48) relative to the at least one carrier (27*a, b*;27'*a,b*) into movement of the holding component (21;21') relative to the at least one carrier (27*a,b*;27'*a, b*).

4. The device according to claim 3, wherein the movable part (42,48) is guided for linear motion relative to the at least one carrier (27'*a*) in a direction at least approximately directed in parallel to the reference axis (z); and wherein the mechanism for translating movement of the movable part (42,48) relative to the at least one carrier (27'*a,b*) into movement of the holding component (21') relative to the at least one carrier (27'*a,b*) comprises a further movable part (41,47) guided for linear motion relative to the at least one carrier (27'*a,b*) in a direction at least approximately directed in parallel to the holding component path and a force transfer device for transferring a force between the movable part (42,48) and the further movable part (41,47).

5. The device according to claim 4, wherein the force transfer device comprises a medium (43) interconnecting the movable part (42,48) and the further movable part (41,47) and wrapped around a wheel (44) rotatably journalled to the at least one carrier (27'*a*).

6. The device according to claim 1, wherein the at least one carrier (27*a,b*;27'*a,b*), the suspension mechanism and the holding component (21;21') form a planar linkage.

7. The device according to claim 1, wherein the reference axis (z) is a first reference axis in a three-dimensional reference co-ordinate system further comprising a second reference axis (y) perpendicular to the first reference axis (z), together defining a plane parallel to a plane in which the holding component path lies; and wherein the device includes at least two carriers (27*a,b*;27'*a,b*), guided for movement on opposite sides of the holding component (21;21') seen in a direction parallel to the second reference axis (y).

8. The device according to claim 7, wherein the at least one support (26;26') comprises a support frame supporting each of the at least two carriers (27*a,b*;27'*a,b*).

9. The device according to claim 1, wherein the at least one controlling device (29*a,b*,30*a,b*, 31*a,b*;37*a,b*) for controlling movement of the at least one carrier (27*a,b*;27'*a,b*) comprises a linear actuator.

10. The device according to claim 9, wherein the linear actuator (29*a,b*,30*a,b*,31*a,b*;37*a,b*) comprises a rotary motor (30*a,b*) and a mechanism (29*a,b*,31*a,b*) for converting rotary motion into linear motion; and wherein the rotary motor (30*a,b*) is arranged on the at least one support (26;26').

11. The device according to claim 1, wherein the holding component path extends in a direction parallel to the reference axis (z) beyond end points of carrier paths (27*a,b*;27'*a, b*) proximal to the processing station (1*a,b*), in use.

12. The device according to claim 1, wherein the at least one carrier (27*a,b*;27'*a,b*) and the suspension mechanism are located laterally adjacent the holding component (21;21') with respect to the holding component path at an end point of the holding component path distal to the processing station (1*a,b*), in use.

13. A system for conveying an object comprising at least a substrate (2) between processing stations (1*a,b*) of a processing apparatus:

wherein the conveying system comprises a transporter (3), movable from processing station (1*a,b*) to processing station (1*a,b*); and wherein the transporter (3) comprises at least one device according to claim 1.

14. An apparatus for processing a substrate (2), comprising a conveying system according to claim 13.

* * * * *